US005254897A

United States Patent [19]

Miller et al.

[11] Patent Number: 5,254,897

[45] Date of Patent: Oct. 19, 1993

[54] ACTIVATION CIRCUIT FOR BATTERY-OPERATED SECURITY ALARM DETECTION SYSTEM

[75] Inventors: Robert E. Miller, Prospect; Tam Nolan, Louisville, both of Ky.

[73] Assignee: Blue Grass Electronics, Inc., Louisville, Ky.

[21] Appl. No.: 958,026

[22] Filed: Oct. 7, 1992

[51] Int. Cl.[5] ............ H01L 41/08

[52] U.S. Cl. ............ 310/319; 340/825.71; 340/825.76

[58] Field of Search ............ 310/338, 339, 316, 317, 310/319, 322; 340/517, 526, 527, 566, 590, 691, 825.71, 825.72, 825.73, 825.74, 825.76

[56] References Cited

U.S. PATENT DOCUMENTS

| | | | |
|---|---|---|---|
| 3,339,104 | 8/1967 | Kushner | 310/339 X |
| 3,665,259 | 5/1972 | Brailsford | 310/319 X |
| 3,863,250 | 1/1975 | McCluskey, Jr. | 310/319 X |
| 4,542,325 | 9/1985 | Kobayashi et al. | 310/319 X |
| 4,585,970 | 4/1986 | Koal et al. | 310/319 X |
| 5,170,087 | 12/1992 | Karr et al. | 310/319 |

*Primary Examiner*—Mark O. Budd

*Attorney, Agent, or Firm*—Middleton & Reutlinger

[57] ABSTRACT

The present invention relates to an activation circuit for a battery-operated security alarm detection system where current drain and, therefore, battery life is of concern. It employs a non-current drawing piezo element which only sees part of the frequency band of interest to briefly activate or wake up a current-drawing electret microphone which has a bandwidth broad enough to sees the entire audio band of interest.

9 Claims, 1 Drawing Sheet

ACTIVATION CIRCUIT FOR BATTERY-OPERATED SECURITY ALARM DETECTION SYSTEM

BACKGROUND OF THE INVENTION (a) Field of the Invention

The present invention relates to an activation circuit for a battery-operated security alarm detection system where current drain and, therefore, battery life is of concern. It employs a non-current drawing piezoelectric ("piezo") element which only sees part of the frequency band of interest to activate or wake up a current-drawing electret microphone which has a bandwidth broad enough to sees the entire audio band of interest. This circuit has particular importance for detectors which attempt to reduce false alarms by evaluating the signals present in a broad frequency band to look for specific expected multiple audio frequency signals which correspond to a specific event to be detected, such as a glass break.

(b) Description of the Prior Art

The electret microphone is often employed with audio frequency detectors which look at multiple frequencies to more accurately detect a specific event. This is because the electret microphone has a generally flat band-pass from about 20 Hertz ("Hz") to about 20 kiloHertz ("kHz"). However, the electret microphone requires a bias current of about 1 milliampere ("mA") to operate. Because of this constant current drain, known applications require hard-wiring the detectors containing an electret microphone to an external current source. There are no known applications of an electret microphone in a detector which employs battery operation, such as a 9 volt ("V") battery, because the battery life is very short. This invention solves this problem.

SUMMARY OF THE INVENTION

The present invention relates to an activation circuit for a battery-operated security alarm detection system which extends battery life by reducing current drain of the battery. This circuit has particular importance for detectors which attempt to reduce false alarms by evaluating the signals present in a broad frequency band to look for specific expected multiple audio frequency signals which correspond to a specific event to be detected, such as a glass break.

A piezo element has a bandwidth which covers some audio frequencies of interest, but not all. However, this piezo element has an advantage in that it does not cause any current drain on a battery. Therefore, a piezo element is employed to sense audio signals within its limited band-pass. Upon receipt of a signal above a threshold level and for a preselected time after the signal drops below the threshold level, the circuitry quickly activates or wakes up another detector, such as an electret microphone. This detector has a broader bandwidth than the piezo element and can be used to evaluate multiple frequencies from about 20 Hertz to 20 kiloHertz, for example. However, the electret microphone causes a current drain on the battery while it is activated or awake. In particular, this circuit works well with glass break detectors where the glass break audio frequencies signals typically last for at least 80 milliseconds.

Finally, the present invention comprises an activation circuit for a current-drawing security alarm detection system, comprising a piezo element having a first desired bandwidth, the piezo element producing an output when a signal having a frequency within the first desired bandwidth and a signal level above a noise threshold is detected and means to activate a current-drawing detector having a second selected bandwidth upon production of the piezo element output. Additionally, means to delay activation of the current-drawing detector for a first preselected time after production of the piezo element output and means to keep the current-drawing detector activated for a second preselected time after the output of said piezo element has ceased can be included.

BRIEF DESCRIPTION OF THE DRAWING

A better understanding of the present invention will be had upon reference to the following description in conjunction with the accompanying drawing, wherein.

DETAILED DESCRIPTION OF THE PREFERRED EMBODIMENT

Figure 1:
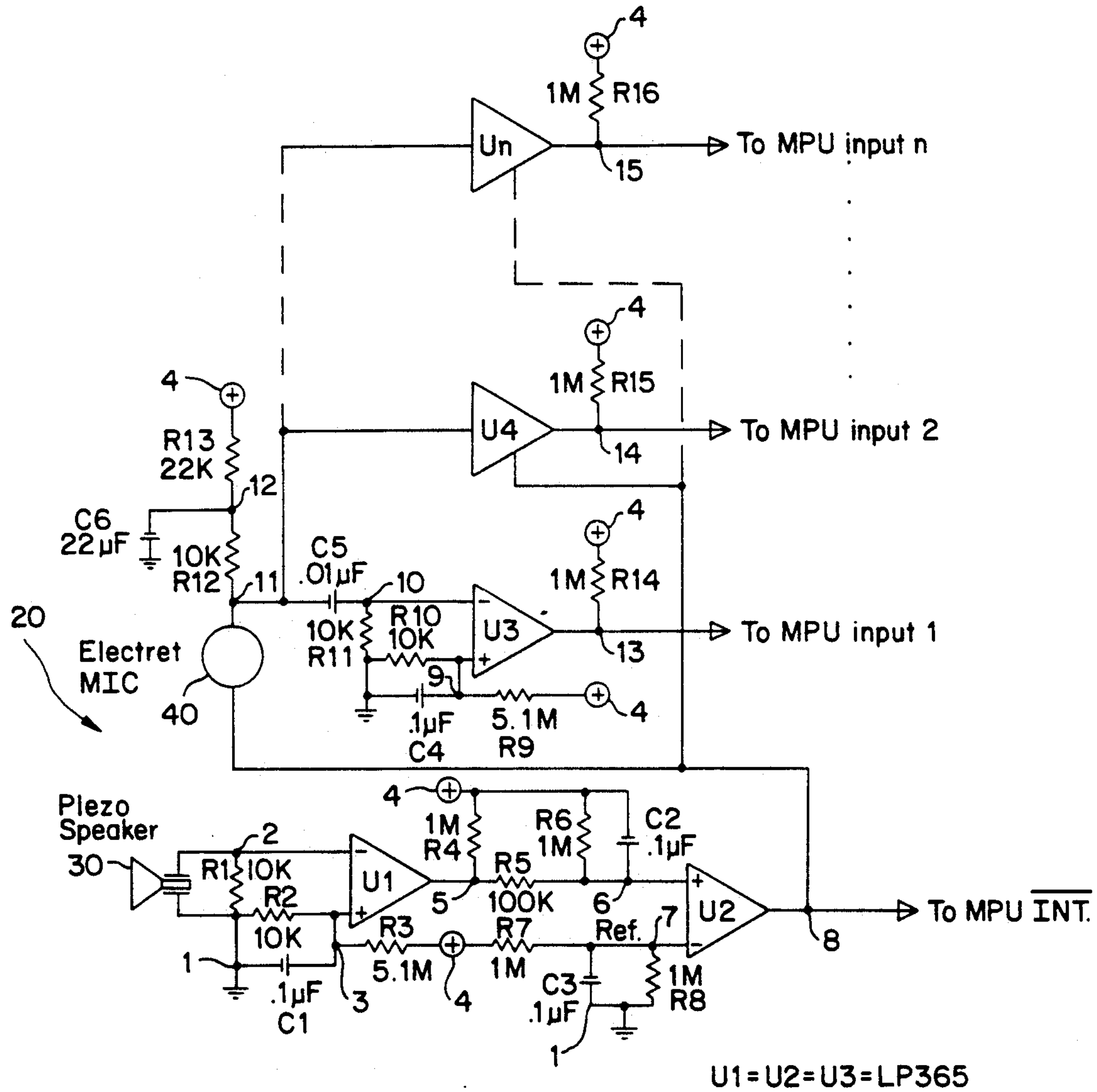
FIG. 1 shows a schematic diagram of an activation circuit for a battery-operated security alarm detection system of the present invention.

While the activation circuit of the present invention can be used with any detector system which looks for selected audio signals having a non-instantaneous duration, this detailed description is presented as related to a detection system which looks to detect breaking glass by analyzing the received signals in multiple frequency bands.

As background information, glass break detectors are typically used to monitor plate, tempered, and laminated glass, each of which presents different audio signals when broken. When a single audio frequency detector is employed, false alarms can exceed twenty per cent, as any audio signal at the single monitored frequency will initiate an alarm. Therefore, to reduce false alarms, it is desirable to monitor multiple frequencies so that two or more expected frequencies must be received to activate the alarm. Besides glass type, its thickness and area, along with the room characteristics, determine the unique audio signals caused by the glass being broken.

The initial contact with a pane of glass will cause it to bow before breaking. This contact causes generation of an audio signal in the 100 Hz range which lasts for about 200 milliseconds ("msec"), for example. However, this bow signal frequency varies depending on the characteristics of the glass and could be as low as 35 Hz for laminated glass, for example. The breaking of the glass causes a higher frequency break signal of generally shorter duration. As an example, this break signal is produced about 5 msec after the 100 Hz range signal. However, the delay between the bow and break signals can vary greatly. This is particularly varied not only by the size of the pane of glass, but also by the method of breaking. In a high speed break, using the pointed end of a crow-bar, for example, the delay between bow and break signals will be less than with a slow speed break, using a covered hammer, for example.

The following are general examples of break signal frequency ranges and pulse durations by glass type generated when the following types of glass are broken. For example, for ¼ inch plate glass, the break signal is in the 5–8 kHz range and for a one foot by one foot pane lasts from about 80–150 msec, depending on how broken. The break signal for a two foot by three foot pane of ¼ inch plate lasts approximately 200 msec. For ¼ inch thick tempered glass, the break signal frequency is in the 3.8–5.5 kHz range. The break signal lasts for about 80 msec for a one foot by one foot glass pane and about 150 msec for a two foot by three foot glass pane. For ¼ inch thick laminate glass, the break signal frequency is in the 3.3–4.5 kHz range. The break signal lasts for about 80 msec for a one foot by one foot glass pane and about 120 msec for a two foot by three foot glass pane. Therefore, by ensuring that both the 100 Hz range bow signal and the 3.3–8 kHz range break signal are received before alarming, the chance of false alarms is greatly reduced. The above examples are for a room in a typical residence, such as a living room, and vary depending on the room geometry, furnishings, and detector location.

Where power consumption, or current draw, is of no concern, a single broad band detector, such as an electret microphone, can be properly biased for continuous monitoring. The signals received by the electret microphone can be fed to appropriate alarm analysis circuitry. However, if the alarm is to be powered by a battery, such as a 9-volt battery, continuous monitoring by an electret microphone can quickly drain the battery. It is unacceptable to require or expect alarm system owners to change detector batteries every other week, for example. According to the *Electronics Engineers Master Catalog* '87–'88, page D-1431, Hearst Business Publications, Inc. (1987), a Duracell 9-volt alkaline battery model MN1604 is rated for a life of 550 mA hours. Given that the normal bias current for an electret microphone is about 1 mA, continuous monitoring would drain this battery in about 22 days, for example. Other batteries have lesser life spans and could require replacement in as little as a couple of days, for example. Therefore, if a minimal current drawing device or a non-current drawing device could be used for continuous initial monitoring and the electret microphone only quickly activated to look for the expected multiple frequency signals of at least 80 msec duration, for example, when there is the possibility of an alarm condition, the life of the detector battery can be greatly increased. In fact, we envision that a piezo element initial monitor can be used with a multiple frequency detector circuitry which only draws 20 microamps, for example, when the broad band electret microphone is asleep. Therefore, we envision 9-volt battery life of 1–2 years instead of less than three weeks. That is the focus of this invention, the circuitry of which is now explained.

FIG. 1 shows activation circuit 20 of the present invention. Activation circuit 20 employs a piezo speaker element 30 for continuous monitoring. As previously mentioned, piezo devices such as element 30 do not require any bias voltage or current to operate.

The frequency response of a piezo speaker or piezo element, such as element 30, is often narrower than necessary to fully evaluate the frequency spectrum of interest. The bandwidth is determined by the physical properties of the element, such as area and thickness. For example, a piezo element 30 could be used with activation circuit 20 which has a 3 dB bandwidth of from about 4–6 kHz. This element 30 would then detect the glass break signal but not the lower glass bow signal. Therefore, piezo element 30 is used to wake up or activate a broader bandwidth detector, such as electret microphone 40 which is a broad band audio device capable of detecting frequencies from about 20 Hz to 20 kHz. Electret microphone 40 has this broader bandwidth due to the small mass of its diaphragm.

Electret Microphone 40 has a bias subcircuit comprising resistors ("R") R13 and R12 and capacitor ("C") C6 and the ground end is left floating from ground, as seen at node 8. The low power comparator U1, one of the four comparators of a National Semiconductor Corporation LP365 micropower programmable quad voltage comparator, for example, has two input bias resistors R1 and R2 and decoupling capacitor C1. The sensitivity resistor R3, shown in this preferred embodiment as a 5.1 Megohm (MΩ) resistor, can be selected for a desired background noise rejection threshold. Alternatively, a variable resistor can selected for R3 which can allow adjustment for each unique detector location. Any audio signal which is within the band-pass of piezo element 30 and which exceeds the background noise threshold set by R3 is directly coupled to the input of U1, identified as node 2.

The output of U1 is identified as node 5. This output is fed into a RC timing network which includes R4, R5, R6, and C2, which are preselected to have a desired RC time constant. This timing network will provide one input signal at node 6 to U2, a second low power voltage comparator and another one of the four comparators of a National Semiconductor Corporation LP365 micropower programmable quad comparator, for example. The other input signal to U2 is a reference voltage signal at node 7, which is controlled by R7, R8, and C3.

In operation, when piezo element 30 senses a signal in its band-pass exceeding the threshold level set by R3, U1 switches, which causes C2 to discharge through R5. When the voltage at node 6 drops below the reference voltage signal at node 7, U2 output switches causing ground potential at node 8, activating electret microphone 40. The time between U1 switching and the activation of electret microphone 40 is defined as the first preselected time. When the signal sensed by piezo element 30 no longer exceeds the R3 threshold, R4 and R6 cause C2 to start to charge. When C2 is sufficiently charged so that the node 6 voltage equals the node 7 voltage, U2 output at node 8 changes state and electret microphone 40 no longer sees ground and is, therefore, deactivated or put back to sleep. The time from when the signal sensed by piezo element 30 no longer exceeds the R3 threshold to deactivation of electret microphone 40 is defined as the second preselected time.

For glass break detectors, the first preselected time, or how quickly the electret microphone 40 is activated after a possible break signal is sensed by piezo element 30, should be a very short time period, because the glass bow and break signals to be analyzed may last only about 80 msec after detection of a possible break signal by piezo element 30, for example. The second preselected time is application unique and should be of sufficient duration to ensure that any signals outside the frequency band-pass of piezo element 30 to be sensed by electret microphone 40 will have time to be received and processed before the electret microphone 40 is deactivated.

R4 (1 MΩ), R5 (100 kΩ), R6 (1 MΩ), R7 (1 MΩ), R8 (1 MΩ), C2 (0.1 microfarad ("μF")), and C3 (0.1 μF) will place ground at node 8, the output of U2, a first preselected time period of 22 msec after an audio signal exceeding the background noise threshold in the band-pass of piezo element 30 has been received by element 30. These shown values also cause the second preselected time period to be approximately 35 msec. If the resistive value of R5 was reduced from 100 kΩ to 10

KΩ, for example, C2 will discharge faster and the first preselected time period would be reduced from 22 msec to 12 msec. Increasing the voltage reference at node 7 will decrease the first preselected time and increase the second preselected time, as C2, when charged, will be closer to the voltage potential at node 7 and will have to discharge less to place ground at node 8, but C2, when discharged, will be further from the voltage potential at node 7 and will take longer to charge.

The output of the timer U2 at node 8 is shown connected to electret microphone 40, but, for other applications, it could be connected to other integrated circuits, such as an operational-amplifier ("op-amp"), that require more current than the piezo element 30 to operate. When activated this output provides a direct path to ground, thereby activating electret microphone 40 or the other connected networks. Immediately after activating the broad band electret microphone 40, audio signal between 20 Hz and 20 kHz, for example, are fed to the inputs of one or more devices, which are identified as U3, U4, . . . , Un, for analysis and processing. For example, U3, U4, . . . , Un can be low power comparators, such as the LP-365; or low power op-amps; or standard op-amps which are on standby or in a sleep mode until activated. As shown, the outputs of U3, U4, . . . , Un are connected to a microprocessing unit for further data processing. For a battery operated glass break detector, this should desirably be a low power consuming microcontroller device, such as, for example, a PIC16C5x Series EPROM-based 8-bit CMOS microcontroller.

The foregoing detailed description is given primarily for clearness of understanding and no unnecessary limitations are to be understood therefrom for modifications can be made by those skilled in the art upon reading this disclosure and may be made without departing from the spirit of the invention and scope of the appended claims.

What is claimed is:

1. An activation circuit for a current-drawing security alarm detection system, comprising:

(a.) a piezo element having a first desired bandwidth, said piezo element producing an output when a signal having a frequency within said first desired bandwidth and a signal level above a noise threshold is detected; and, (b.) means to activate a current-drawing detector having a second selected bandwidth upon production of said piezo element output.

2. An activation circuit of claim 1, further comprising:

means to delay activation of said current-drawing detector for a first preselected time after production of said piezo element output.

3. An activation circuit of claim 1, further comprising:

means to keep said current-drawing detector activated for a second preselected time after said output of said piezo element has ceased.

4. An activation circuit of claim 1, wherein said current-drawing detector comprises an electret microphone.

5. An activation circuit for a current-drawing security alarm detection system, comprising:

(a.) a piezo element having a first desired bandwidth, said piezo element producing an output when a signal having a frequency within said first desired bandwidth and a signal level above a noise threshold is detected;

(b.) means to activate a current-drawing detector having a second selected bandwidth upon production of said piezo element output.

(c.) means to delay activation of said current-drawing detector for a first preselected time after production of said piezo element output.

(d.) means to keep said current-drawing detector activated for a second preselected time after said output of said piezo element has ceased.

6. An activation circuit of claim 5, wherein said current-drawing detector comprises an electret microphone.

7. An activation circuit of claim 5, wherein said first desired bandwidth includes frequencies from at least 4 to 6 kiloHertz and wherein said second selected bandwidth includes frequencies from at least 35 Hertz to 8 kiloHertz.

8. An activation circuit of claim 5, wherein said first preselected time does not exceed 25 milliseconds and said second preselected time is at least 30 milliseconds.

9. An activation circuit of claim 5, wherein said first preselected time does not exceed 10 milliseconds and said second preselected time is at least 30 milliseconds.

* * * * *